United States Patent [19]

Matero

[11] Patent Number: 5,357,221

[45] Date of Patent: Oct. 18, 1994

[54] REGULATION OF MODULATOR I AND Q SIGNAL PHASING

[75] Inventor: Jorma Matero, Oulu, Finland

[73] Assignee: Nokia Mobile Phones Ltd., Salo, Finland

[21] Appl. No.: 934,945

[22] Filed: Aug. 25, 1992

[30] Foreign Application Priority Data

Aug. 27, 1991 [FI]  Finland .................. 914028

[51] Int. Cl.⁵ .................. H03C 1/00; H03C 3/00; H03B 27/00; H03L 1/02
[52] U.S. Cl. .................. 332/123; 307/262; 328/155; 331/45; 331/60; 331/76; 331/176; 375/59; 455/91
[58] Field of Search .............. 332/123, 103, 104, 101, 332/102; 307/262; 331/176, 12, 38, 40, 45, 60, 76; 329/308; 328/155; 375/59; 455/91

[56] References Cited

U.S. PATENT DOCUMENTS

| | | | |
|---|---|---|---|
| 3,555,458 | 1/1971 | Fombonne | 332/44 |
| 3,921,079 | 11/1975 | Heffner et al. | 328/155 X |
| 4,475,088 | 10/1984 | Beard | 328/155 X |
| 4,918,405 | 4/1990 | Herleikson | 331/176 X |

FOREIGN PATENT DOCUMENTS

| | | | |
|---|---|---|---|
| 265218 | 4/1988 | European Pat. Off. | H03C 1/52 |
| 2196195 | 4/1988 | United Kingdom . | |
| 2244611A | 12/1991 | United Kingdom . | |
| 2248737A | 4/1992 | United Kingdom . | |
| 2249442A | 5/1992 | United Kingdom . | |

*Primary Examiner*—David Mis
*Attorney, Agent, or Firm*—Perman & Green

[57] ABSTRACT

Electronic apparatus generates first and second output signals having a quadrature phase relationship therebetween. A local oscillator signal with a reference phase is applied as an input to first and second signal branches. The second signal branch includes a phase control circuit for subjecting input signals passing therethrough to a determined phase shift. The phase control circuit is responsive to an applied DC control signal to adjust any phase shift error through the phase shift circuit from a predetermined phase shift to assure that the second output signal exhibits the required quadrature phase relationship to the first output signal. A memory/microprocessor combination stores a digital value that is indicative of a DC control signal which must be applied to the control circuit to alter the phase shift through the phase control circuit to the predetermined phase shift. The microprocessor accesses the digital parameter and applies it to the phase control circuit through a digital to analog converter. The apparatus is included as part of a radiotelephone wherein quadrature signals are required for modulation purposes.

5 Claims, 1 Drawing Sheet

REGULATION OF MODULATOR I AND Q SIGNAL PHASING

FIELD OF THE INVENTION

The invention relates to the regulation of phasing of In-Phase (I) and Quadrature (Q) injection signals for use, for example, by a modulator of radio frequency (RF) signals.

BACKGROUND OF THE INVENTION

For modulators in RF systems using I and Q signals, the I and Q signals may be derived from a local oscillator, the I signal being in-phase with the local oscillator signal and the Q signal being 90 degrees out-of-phase with the local oscillator signal. The object of phase regulation is to maintain, as closely as possible, the 90 degree phase difference between the I and Q signals.

At present, for example in I/Q modulators used in digital radio telephones, either a resistance trimmer or a trimmer capacitor is used for regulating the phasing of I and Q signals, used to-control the modulator. The trimmers complicate tuning i.e. the regulating of the phase difference, and this results in additional manufacturing costs. Control is also difficult, since the trimmers must be adjusted through an opening in the shielding body, or the intermediate body enveloping the modulator used to electrically and mechanically shield it. Also, mechanically controllable components are less reliable than fixed components. Furthermore, mechanical solutions determine the location of the trimmers, in which case it is difficult to achieve an optimal electrical solution.

SUMMARY OF THE INVENTION

According to the present invention, there is provided a circuit arrangement for generating first and second output signals from an input signal, the first and second output signals having a predetermined phase-difference therebetween, the circuit arrangement comprising means for controlling the phase of the first output signal, to maintain the predetermined phase-difference between the first and second output signals, in response to a control signal coupled thereto.

This has the advantage that the phasing of the I and Q injection signals can be regulated more advantageously than at present. Circuit design can be improved as the mechanical constraints do not determine the placement of the components. Interference shielding and RF-tightness are also improved and the reliability of the devices is improved with respect to the components to be controlled.

A circuit arrangement in accordance with the invention can be incorporated in an electronic. Apparatus, for example, in a radio telephone for providing in-phase and quadrature signals for the radio telephone's modulator.

The phasing of the I and Q injection signals in a radio telephone modulator can be checked and regulated in connection with maintenance in the same manner as during manufacture, without opening the mobile telephone.

DESCRIPTION OF THE DRAWING

An embodiment of the invention will now be described, by way of example only, with reference to the accompanying figure which illustrates a circuit for producing I and Q signals for a modulator in a radio telephone, part of which is illustrated here in block diagram form.

DETAILED DESCRIPTION OF THE INVENTION

Figure 1:
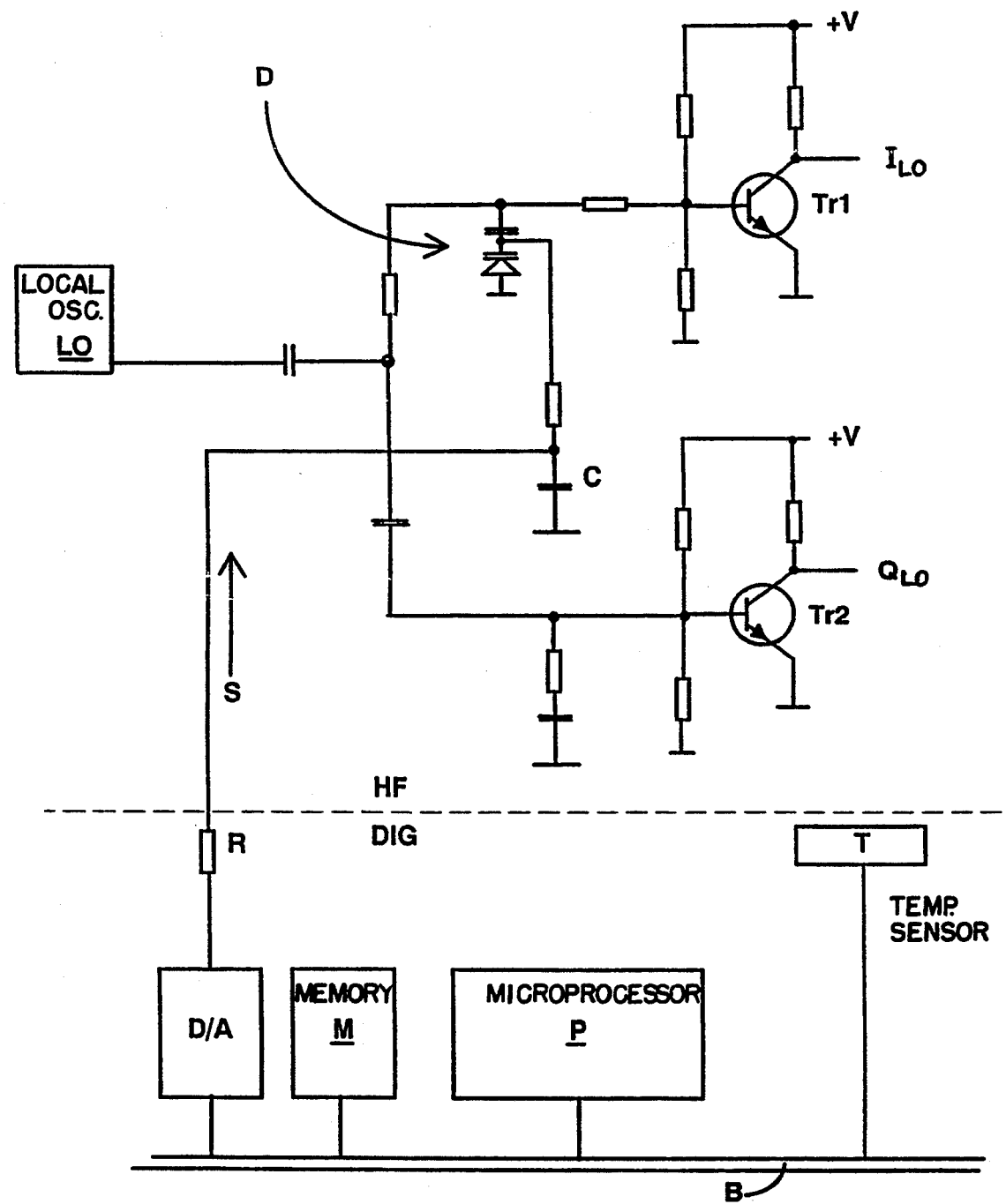

FIG. 1 illustrates those parts of a digital radio telephone which are relevant to the present invention. The upper part of FIG. 1—designated HF and shown above the dotted line—is a radio-frequency (RF) circuit in which the I and Q injection signals for the modulator (not shown) of the radio telephone are derived from a signal LO supplied from a local oscillator (not shown). The output signals $I_{LO}$ and $Q_{LO}$, from the circuit HF, are supplied from the collectors of transistors Tr1 and Tr2 respectively. The phase between the two output signals $I_{LO}$ and $Q_{LO}$ is regulated to maintain, as closely as possible, a 90-degree phase difference between the I and Q signals. The use of these signals to control the I and Q modulator is not discussed here, since it is well known to a person skilled in the art, and is not relevant to the present invention.

The lower part of FIG. 1, below the dotted line and designated DIG, shows, in block diagram form, other relevant parts of the radio telephone. These are a microprocessor P, a memory M, a digital-to-analog (D/A) converter D/A and a temperature sensor T coupled via a channel, or data bus, B to the microprocessor P. The microprocessor P controls via the channel B the operation of the radio telephone, and is operable, using a program and data recorded in the memory M, to generate a digital control signal for coupling to the D/A converter, which provides, at its output an analog control signal S, from the digital control signal, which is coupled via filtering comprising a resistor R1 and a capacitor C1, to the RF circuit HF generating the I and Q signals.

The analog control signal s is used for controlling a capacitance diode D coupled to the I signal branch. In the embodiment described herein, the capacitance diode D is coupled via a fixed value capacitor C2 and a resistor R2 to the base of transistor Tr1 to regulate the phase of output signal $I_{LO}$ with respect to the quadrature signal $Q_{LO}$. With the exception of the capacitance diode D and its control signal S, the structure of the RF circuit HF is known to a person skilled in the art.

The analog control signal S is a DC voltage. The capacitance of the diode D varies in dependence upon the reverse bias voltage over the diode D which is coupled to that branch of the RF circuit HF generating the in-phase signal $I_{LO}$. By varying the capacitance of the diode D, the phase of the in-phase signal $I_{LO}$ can be varied i.e. by varying the value of the analog control signal s the phase difference between the in-phase and quadrature signals $I_{LO}$, $Q_{LO}$ can be varied.

The phasing of the in-phase and quadrature $I_{LO}$, $Q_{LO}$ signals is done in connection with a control step, preferably during final testing, using an external testing apparatus. During testing the telephone is set to a "local state". In this "local state", it is only possible to control the telephone's functions using an externally coupled computer. This "local state" is reserved for production and maintenance purposes. During testing the telephone is set to transmit continuously, unlike in normal operation where transmission is pulsed i.e. the transmitter is only "on" during the transmission slot. During testing, a test signal for the modulator is generated by a Digital Signal Processor (DSP) provided in the telephone. The DSP is used to provide modulated baseband signals for the modulator as is known to a person skilled in the art. During testing, continuous transmission is set and the DSP generates specified baseband signals i.e. testing signals, with a known spectrum. These testing signals comprise a pre-selected bit sequence. The actual transmitted signal is measured to determine the phase difference between the I and Q signals using narrow band RF measurement in a manner known to a person skilled in the art. The results of the measurement are then analyzed by an externally coupled computer. On the basis of this measurement, a correction signal generated in dependence upon the difference between the measured phase difference and the known phase difference is coupled to the channel B from the computer and thus to the processor P, to regulate the phase between signals $I_{LO}$ and $Q_{LO}$ using a closed loop so that the phase difference obtained for the signals $I_{LO}$ and $Q_{LO}$ is as close as possible to 90 degrees.

When an optimum value of this correction signal is determined, i.e the value which gives a phase-difference as close as possible to 90 degrees, this value is stored in the memory M, which is preferably an electronically erasable programmable read-only memory (EEPROM). This optimum value is used then to set the level of the control signal, S, and in normal operation the microprocessor P controls the D/A converter D/A on the basis of this optimum value, possibly corrected by a temperature-correction value, as explained below.

The temperature sensor T, detects the internal operating temperature of the radio telephone and generates a corresponding temperature signal on the basis thereof. This temperature signal is coupled to the microprocessor P via channel B. A look-up table containing correction values corresponding to the predetermined values of the temperature signal can be recorded in the memory M. The correction values can be determined experimentally and be recorded in the memory. Preferably they are, however, measured at predetermined temperatures in connection with the final testing of the telephone, whereafter the correction values are recorded in the look-up table, against the corresponding temperatures. In practice, the microprocessor P reads from the memory M the correction value indicated by a signal generated by the sensor T and on the basis of this, corrects the control value stored in the memory and used in generating the digital control signal and thus the analog control signal S, ie. the control voltage, fed via the digital-to-analog converter D/A to the capacitor diode D. The temperature correction can also be arranged so that, in connection with the testing, only a small amount of correction data is recorded in the memory, and during operation the processor P interpolates, using an algorithm and a look-up table stored in the memory, the correction value corresponding to the temperature measured by the sensor T. Any temperature creep of the tuning is compensated for by this temperature correction.

It will be clear from the foregoing description, to a person skilled in the art, that variations are possible within the scope of the present invention.

For example, the analog control signal S could be coupled to the quadrature branch rather than to the in-phase branch.

I claim:

1. An electronic apparatus including a circuit for generating first and second output signals from an input signal, the first and second output signals having a quadrature phase relationship therebetween, comprising:

local oscillator means for providing said input signal;

a first signal branch connected to said local oscillator means for receiving said input signal and for providing said first output signals;

a second signal branch connected to said local oscillator means for receiving said input signal and or providing said second output signals, said second signal branch including phase control means for subjecting said input signal to a determine phase shift and responsive to an applied DC control signal to adjust a phase shift error through said phase shift means from said determined phase shift, so as to assure that said second output signal exhibits said quadrature phase relationship with said first output signals;

a memory for storing a digital parameter indicative of a DC control signal that when applied to said phase control means enables an alteration of a phase shift of said input signal through said phase control means to said determined phase shift;

a microprocessor associated with said memory for accessing said digital parameter; and a digital-to-analog converter coupled to said phase control means for converting said digital parameter to said DC control signal and applying said DC control signal to said phase control means.

2. An electronic apparatus according to claim 1 wherein the phase control means comprises a capacitance diode whose capacitance varies in dependence upon the DC control signal, the phase of the first output signal varying in dependence upon the value of the capacitance and thus upon the value of the DC control signal.

3. An electronic apparatus according to claim 1 in which the digital parameter stored in said memory corresponds to a DC control signal value determined during testing of said electronic apparatus which adjusts for any deviation through said phase control means of phase shift from said determined phase shift.

4. An electronic apparatus according to claim 1 and further comprising:

temperature sensing means for sensing a temperature of the electronic apparatus and for transmitting a temperature signal in response thereto to the microprocessor, the microprocessor operable to generate a correction of said digital parameter in response to the temperature signal for varying the value of the DC control signal to compensate for the temperature variation.

5. An electronic apparatus according to claim 1 wherein the electronic apparatus is a digital radio telephone, comprising a radio frequency modulator, the first and second output signals being coupled to the radio frequency modulator for control thereof.

* * * * *